United States Patent

Uchino et al.

[11] Patent Number: 5,814,922
[45] Date of Patent: Sep. 29, 1998

[54] ANNULAR PIEZOELECTRIC TRANSFORMER

[75] Inventors: Kenji Uchino; Burhanettin Koc, both of State College, Pa.

[73] Assignee: The Penn State Research Foundation, University Park, Pa.

[21] Appl. No.: 972,942

[22] Filed: Nov. 18, 1997

[51] Int. Cl.$^6$ .................................................. H01L 41/08
[52] U.S. Cl. ............................................ 310/359; 310/366
[58] Field of Search ................................. 310/358, 359, 310/366

[56] References Cited

U.S. PATENT DOCUMENTS

| | | | |
|---|---|---|---|
| 2,830,274 | 4/1958 | Rosen et al. | 310/358 |
| 2,974,296 | 3/1961 | Rosen | 310/359 |
| 2,976,501 | 3/1961 | Mattiat | 310/359 |
| 3,562,792 | 2/1971 | Berlincourt et al. | 310/359 |
| 5,278,471 | 1/1994 | Uehara et al. | 310/328 |
| 5,365,141 | 11/1994 | Kawai et al. | 310/359 |
| 5,371,430 | 12/1994 | Sato et al. | 310/359 |
| 5,402,031 | 3/1995 | Tagami et al. | 310/359 |
| 5,440,195 | 8/1995 | Ohnishi et al. | 310/359 |

FOREIGN PATENT DOCUMENTS 405-284764  10/1993  Japan ..................................... 310/359

OTHER PUBLICATIONS

Ferroelectric, 1986, vol. 68, pp. 225–234, H. Tsuchiya et al., "Design Principles for Multilayer Piezoelectric Transformers".

*Primary Examiner*—Mark O. Budd
*Attorney, Agent, or Firm*—Thomas J. Monahan

[57] ABSTRACT

A piezoelectric transformer using a piezoelectric annulus, divided into sections, includes at least one input and one output electrode configuration. The input electrodes are formed by covering top and bottom surfaces of the divided section of piezoelectric annulus. The low impedance portions, which are input regions, are poled parallel to the thickness direction and the high impedance portions, which are output regions, are poled tangentially. The transformer is operable at several radial mode resonance frequencies of piezoelectric ring. Two stepped up ac output voltages, in phase or 180 degree out of phase, can be obtained at several resonance frequencies of the piezoelectric annulus. The transformer is also operable as a step-down transformer by inverting the input and output ports.

9 Claims, 6 Drawing Sheets

5,814,922

ANNULAR PIEZOELECTRIC TRANSFORMER

FIELD OF THE INVENTION

This invention relates to piezoelectric transformers and, more particularly, to a piezoelectric transformer configured in the form of an annulus that is adapted to provide both in-phase and out-of-phase output voltages.

BACKGROUND OF THE INVENTION

Conventional step-up or step-down transformers employ electromagnetically coupled primary and secondary windings. When, however, a small size transformer is required, it is difficult to achieve small size with electromagnetic transformer configurations. Piezoelectric transformers have been known for many years and lend themselves well to miniaturization. A piezoelectric transformer is a transducer which employs piezoelectric properties of a material to achieve a transformation of a voltage or current or impedance.

In operation, a piezoelectric transformer initially converts an applied electrical signal into mechanical vibration, followed by a reconversion of the mechanical vibration back into electrical energy. In U.S. Pat. No. 2,974,296 to Rosen, a variety of piezoelectric transformer designs are shown. FIG. 1 hereof is a reproduction of an embodiment shown in the Rosen patent and includes a piezoelectric material 3 which is polled across its thickness dimension between electrodes 1 and 2. Segment 4 of the piezoelectric material is polled along its longitudinal direction and couples to a further electrode 5. When an AC voltage, of a frequency that is a longitudinal resonance frequency of piezoelectric material 3, is applied between electrodes 1 and 2 (e.g., a low impedance section), the vibration of piezoelectric material 3 causes a high strain in segment 4, so that a voltage is generated between end electrode 5 and bottom electrode 2.

FIGS. 2A and 2B illustrate a further embodiment of the Rosen-type transformer wherein the overall configuration of the transformer is in the form of a disk. Electrodes 10 and 15 encompass piezoelectric disk 12 and a rim electrode 13 encircles disk 12. The portion of disk 12 between electrodes 10 and 15 is polled across the thickness dimension and the outermost annular portion of disk 12 is polled radially. The output signal is taken between electrodes 13 and 15.

Still another version of a piezoelectric transformer shown by Rosen is illustrated in FIG. 2C wherein a piezoelectric body 17 is of annular configuration and is divided into two approximately semi-circular regions. In a driving region 18, the piezoelectric body is polarized in a direction across the thickness of the annulus. The output region 19 is polarized in opposing tangential directions. Input electrodes sandwich driving region 18. An output electrode cooperates with output region 19 and couples to a load. In operation, an input signal applied to the input electrodes occasions an increase in the average radius of body 17 and, concomitant therewith, a change in the circumference and radius of the annulus. The variation in circumference occasions similar stresses and result in strains in output region 19.

While the piezoelectric transformers shown by Rosen can achieve step-up/step-down voltage transformations, there is no teaching as to how to achieve either in-phase or 180° out-of-phase signals therefrom. Certain applications of piezoelectric transformers require such a capability.

Accordingly, it is an object of this invention to provide an improved piezoelectric transformer which enables either in-phase or out-of-phase signals to be achieved from a known phase input signal.

It is another object of this invention to provide an improved piezoelectric transformer which provides both step-up and step-down voltage capability, while also enabling in-phase and out-of-phase voltage transformations.

SUMMARY OF THE INVENTION

A piezoelectric transformer incorporating the invention is configured in the form of an annulus of piezoelectric material. In a preferred embodiment, the piezoelectric annulus comprises at least a first segment and a second segment, each segment comprising a circumferential extent of the annulus of less than 180°. Each of the first segment and second segment is polled across its thickness dimension and is further covered by electrodes on the major surfaces of the annulus. A third segment of the annulus is positioned between ends of the first segment and the second segment and is polled in a direction generally tangential to the annulus. An electrode is positioned within the third segment. When an input signal at a resonant frequency of the piezoelectric annulus is applied to the first and second segments, an output signal is generated at the third segment electrode which may be either in-phase or out-of-phase with the input, depending upon the electrical connections between the electrodes of the first segment and second segment.

BRIEF DESCRIPTION OF THE DRAWINGS

FIG. 5A is a diagrammatic perspective view of a third embodiment of the invention which is a multi-layer version of the first embodiment shown in FIG. 3a.

DETAILED DESCRIPTION OF THE PREFERRED EMBODIMENTS

Figure 1:
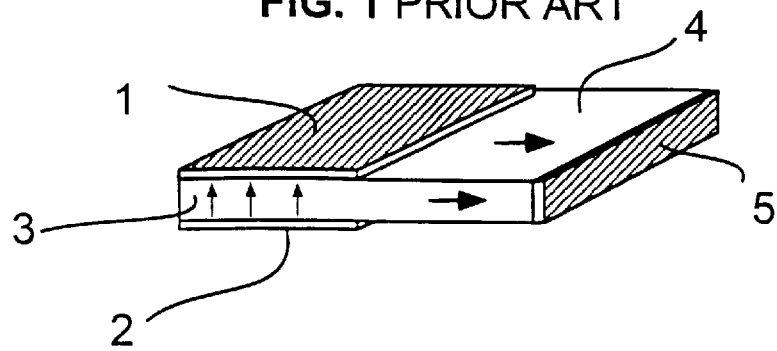
FIG. 1 is a perspective view of a prior art piezoelectric transformer which employs both lateral and longitudinal polling.
Figure 2A:
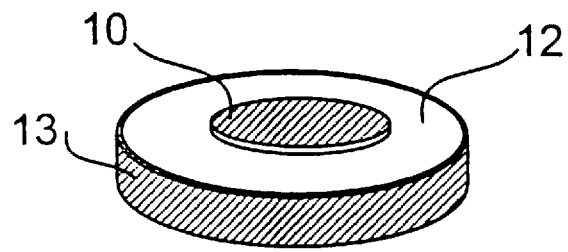
FIGS. 2A and 2B are perspective and cross-sectional views of a further piezoelectric transformer formed into a disk shape.
Figure 2B:
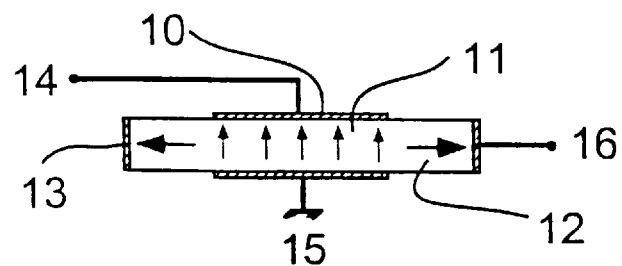
Figure 2C:
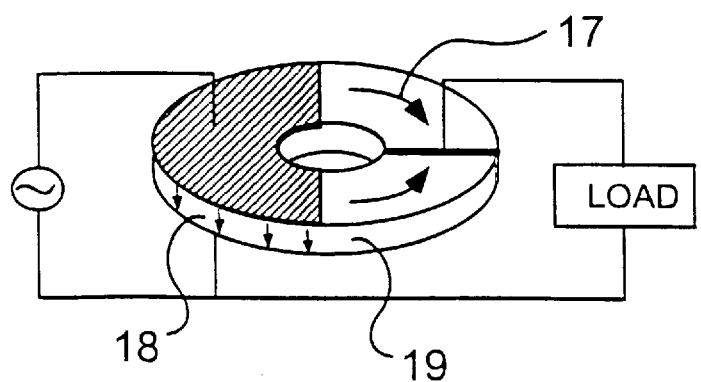
FIG. 2C is a perspective view of a prior art piezoelectric transformer taking the form of an annulus with both input and output electrodes.
Figure 3A:
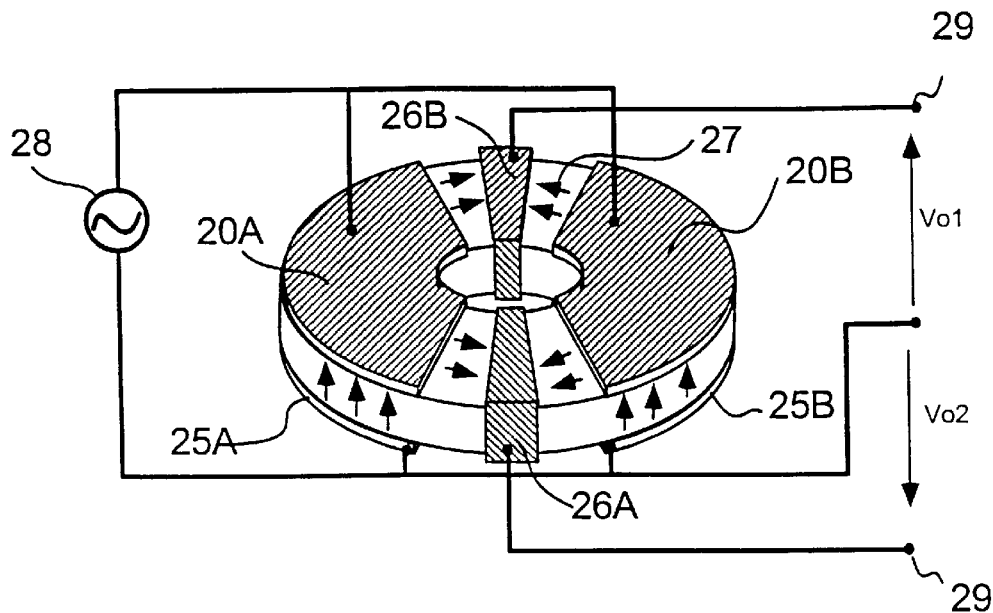
FIGS. 3A and 3B are, respectively, perspective and top plan views of a first embodiment of a piezoelectric transformer in accordance with the invention hereof.
Figure 3B:
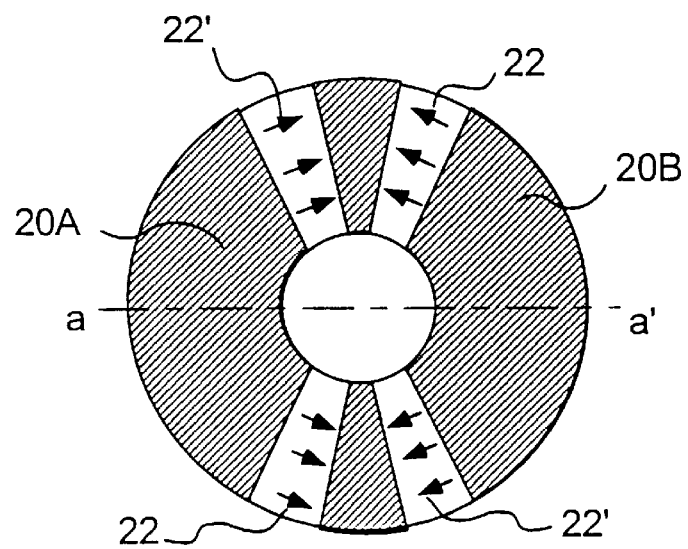
Figure 3C:
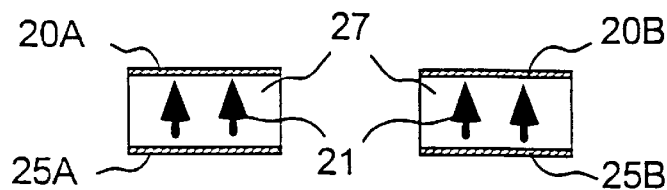
FIG. 3C is a cross-sectional view of the piezoelectric transformer of FIGS. 3A and 3B, taken along line a-a' in FIG. 3B.

Referring now to FIGS. 3A–3C, a first embodiment of a piezoelectric transformer in accord with the invention is illustrated. An annular-shaped piezoelectric body 21 has electrodes 20A and 20B positioned in opposing fashion on a first surface and identically configured electrodes 25A and 25B on the lower surface. A pair of ring-shaped output electrodes 26A and 26B are positioned between the respective ends of input electrodes 20A, 25A and 20B, 25B.

Piezoelectric body 21 is polled across its thickness dimension between electrodes 20A and 25A and 20B and 25B, respectively. A diagram of the aforesaid polling is shown in FIG. 3C (along line a-a' in FIG. 3B). Piezoelectric body 21, in regions 22 and 22' is polled in opposing tangential directions, as shown in FIG. 3B. Electrodes 20A and 20B are electrically tied together as are electrodes 25A and 25B. An input signal source 28 is coupled between electrodes 20A, 20B and electrodes 25A, 25B. Output signals are taken at output terminals 29, 29' from output electrodes 26A and 26B.

In the configuration shown in FIG. 3A, the piezoelectric structure acts as a step-up transformer such that when an input signal, having a frequency that matches a resonant frequency of piezoelectric body 21, is applied between electrodes 20A, 20B and 25A, 25B, a stepped-up voltage is obtained between terminals 29, 29'. When the aforesaid input signal is applied between electrodes 20A, 20B and 25A, 25B, a radial mechanical resonance is induced in piezoelectric body 21. The stresses within piezoelectric body 21, as a result of the resonating action, modulate the tangential polling and induce signals on output electrodes 26A and 26B. The input-to-output coupling of energy is highly efficient due to the closed piezoelectric path. Further, the output signal phase at terminals 29, 29' with the connections shown as shown in FIG. 3A, is in-phase with the input signal phase produced by signal source 28.

In one experimental embodiment, the input frequency was chosen to be 140 kHz. When a voltage of 1 volt at 148 kHz was applied by signal source 28, an output voltage of 13 volts was obtained at output terminals 29, 29'.

Figure 3D:
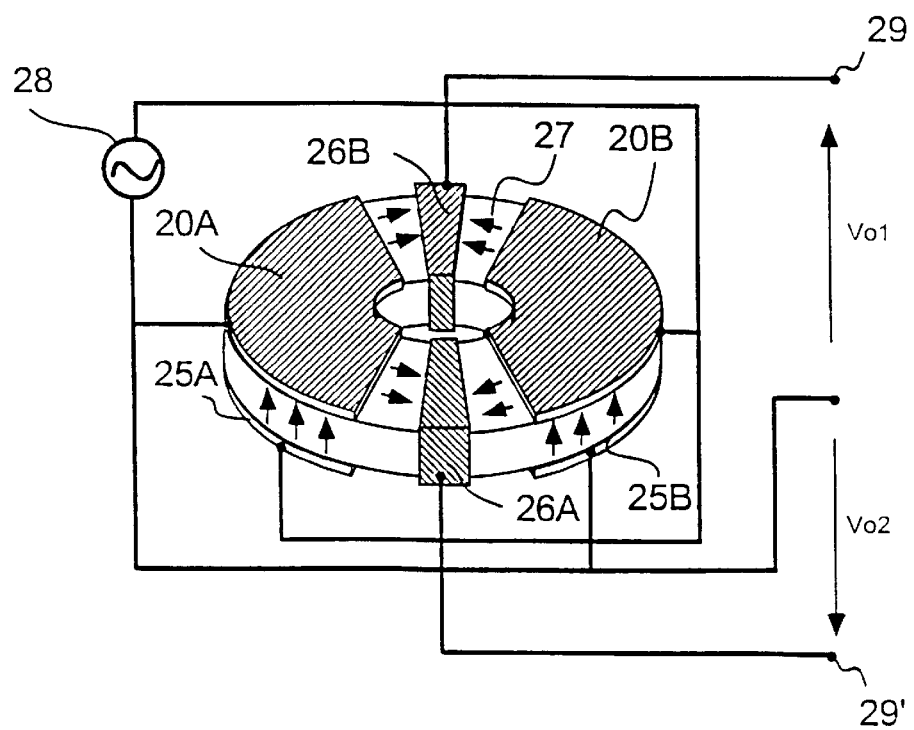
FIG. 3D is a perspective views of the first embodiment of FIG. 3A, but with electrical connections which allow a 180° phase shift between the input signal and the output signal.

A 180° phase shift from the input signal can be achieved by connecting the electrodes as shown in FIG. 3D. Therein, electrodes 20A and 25B are electrically connected as are electrodes 25A and 20B. Source 28 applies the input signal between electrodes 20A and 20B. When the input signal is applied between electrodes 20A and 20B, the output appearing at terminals 29, 29' is 180° phase shifted, but still illustrates a substantial step-up in voltage from the applied signal voltage.

Figures 4A, 4B:
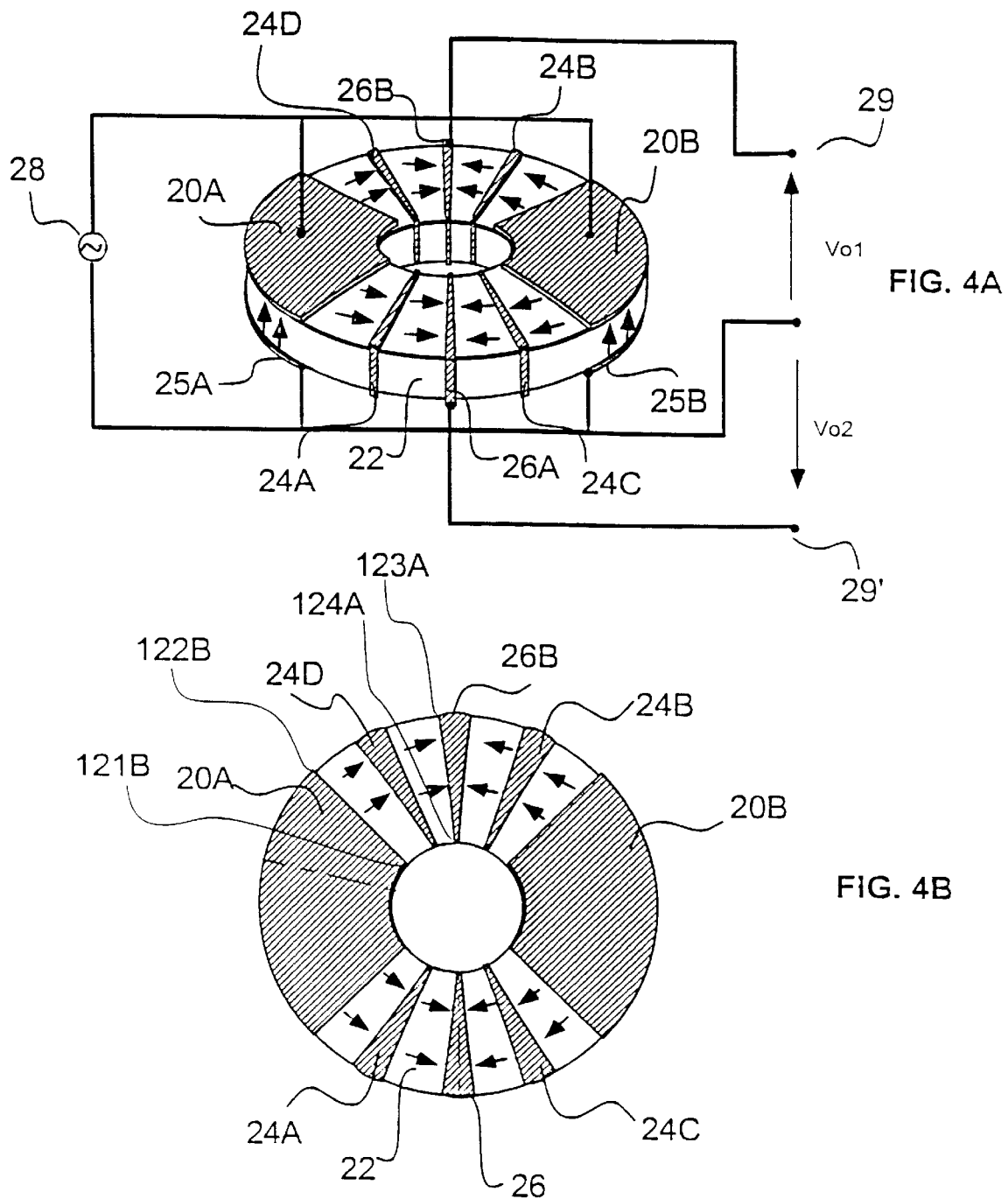
FIGS. 4A and 4B are diagrammatic perspective and top views, respectively, of a second embodiment of a piezoelectric transformer in accordance with the present invention.

Referring to FIGS. 4A and 4B, a second embodiment of a piezoelectric transformer is illustrated which improves the step-up ratio of the first embodiment shown in FIG. 3. An annular shaped piezoelectric body is divided into four equal regions. Top and bottom surface regions 20A, 20B, 25A and 25B are covered with electrode material. Similar to first embodiment, the piezoelectric body is poled across its thickness direction between electrodes 20A, 25a and 20B, 25B, respectively.

Generally, for the first embodiment in FIGS. 3, the wider is the tangentially poled section 22, the higher is the step up ratio of the transformer. However, it is difficult to get uniform tangential poling from a wider empty section 22. This is because the distance between points 123A and 122B is longer than the distance between 124A and 121B in FIG. 4B. During poling treatment, a high DC electric field is concentrated between the points 121B and 124A and may cause electrical breakdown on the sample. To overcome this problem, three narrow ring-shaped conductors 24A, 24B, 24C and 24D are placed on the empty regions (22) of the annulus and poling is accomplished between adjacent rings.

The working principle of the second embodiment is identical to first embodiment and the only difference is that narrow rings 24A, 24B, 24C and 24D are left as floating electrodes. More specifically, in the embodiment of FIG. 4 only output electrode 26A is utilized and electrode 26B has been eliminated. In this instance, the output signal is taken between output electrode 26A and the common conductor from signal source 28. When an input signal is applied between electrodes 20A and 25A, piezoelectric ring 22 vibrates at a second mode radial frequency and an output voltage is developed between electrodes 26 and 25A.

Figure 5A:
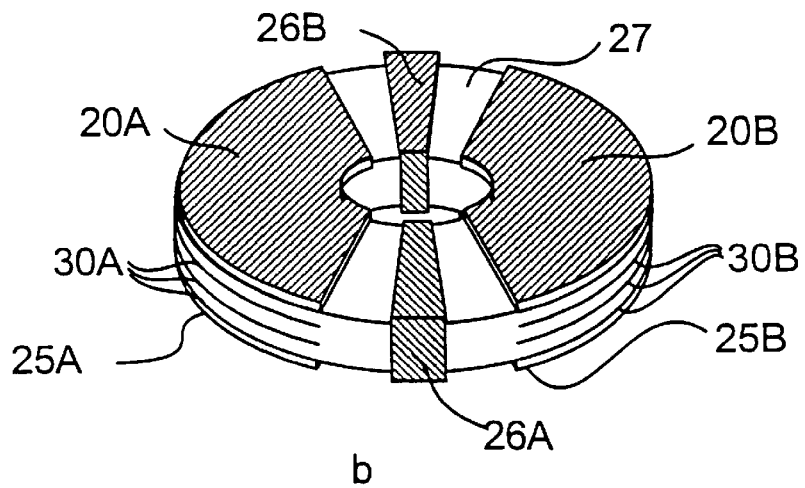
Figure 5B:
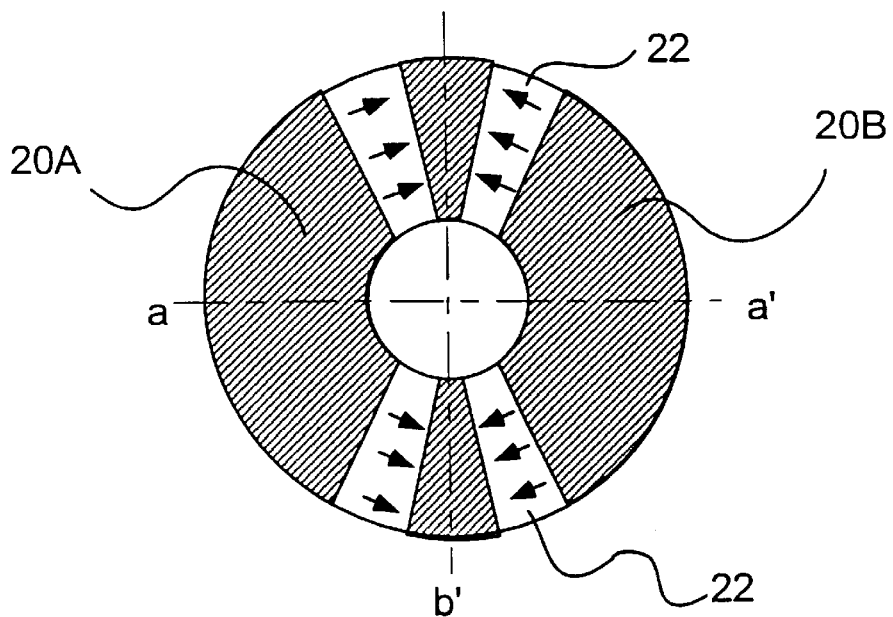
FIG. 5B is a top plan view of the embodiment of FIG. 5A.
Figure 5C:
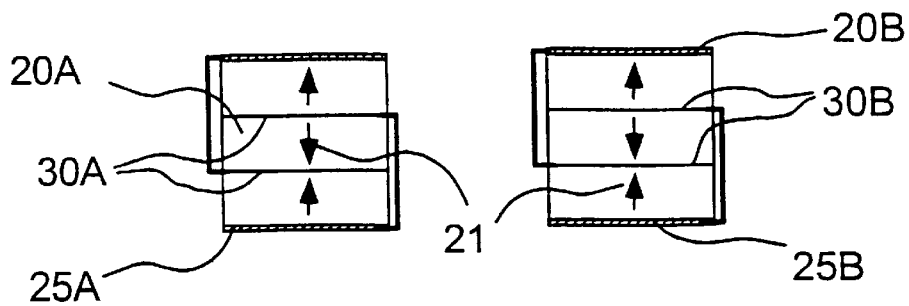
FIGS. 5C is a cross-sectional view of the piezoelectric transformer of the FIGS. 5A and 5B, taken along line a-a' in FIG. 5B.

Referring to FIGS. 5A–5C, a multi-layer embodiment of the piezoelectric transformer of FIG. 3 is illustrated. The input and output connections to the piezoelectric transformer of FIGS. 5A–5C are identical to those previously described above. Further, the polling is also substantially identical to that described above, except that interior electrodes 30A and 30B are polled as shown in FIG. 5C at 31.

The provision of additional input electrode layers 30A and 30B provides increased levels of step-up voltage between output electrodes 26A, 26B. Note that one interior input electrode 30A is coupled to lower input electrode 25A while another is coupled to upper electrode 20A, to provide a balanced configuration. Similar arrangements are present between internal electrodes 30B and upper and lower input electrodes 20B and 25B. The operation of the embodiment of FIG. 5 is substantially the same as the embodiment of FIG. 3.

Figure 6:
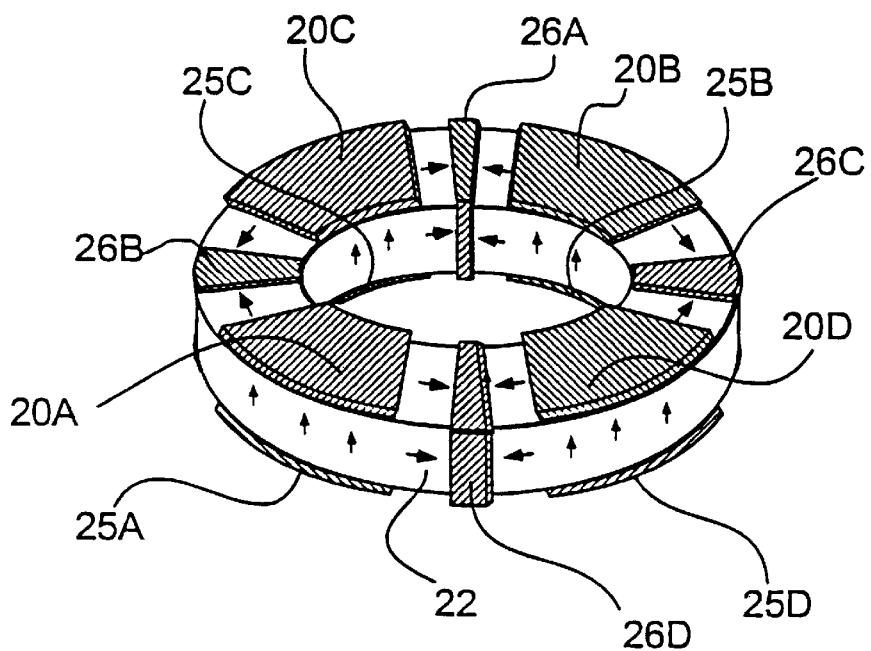
FIG. 6 is a diagrammatic perspective view of a fourth embodiment of the invention, with four input and four output electrodes.

Turning now to FIG. 6, the configuration shown in FIG. 3 has been altered by bisecting each of the input electrodes and positioning an output electrode in the space therebetween. Thus, further output electrodes 26B and 26C are now positioned between input electrodes 20A, 20C and 20B, 20D, respectively. Similar structures are present on the lower surface of the piezoelectric transformer. Top electrodes (i.e., driving regions) 20A, 20B, 20C and 20D are coupled together as are bottom electrodes 25A, 25B, 25C and 25D. When an input signal is applied between electrodes 20A and 25A at a first mode resonance frequency of the annulus, four stepped up output voltages are developed between output electrodes 26A–26D and bottom electrodes 25. If the frequency of the input signal is changed to a second mode resonance frequency, the output signals at output electrodes 26A and 26D have a 180° phase difference to the output signals at output electrodes 26B and 26C.

Figure 7:
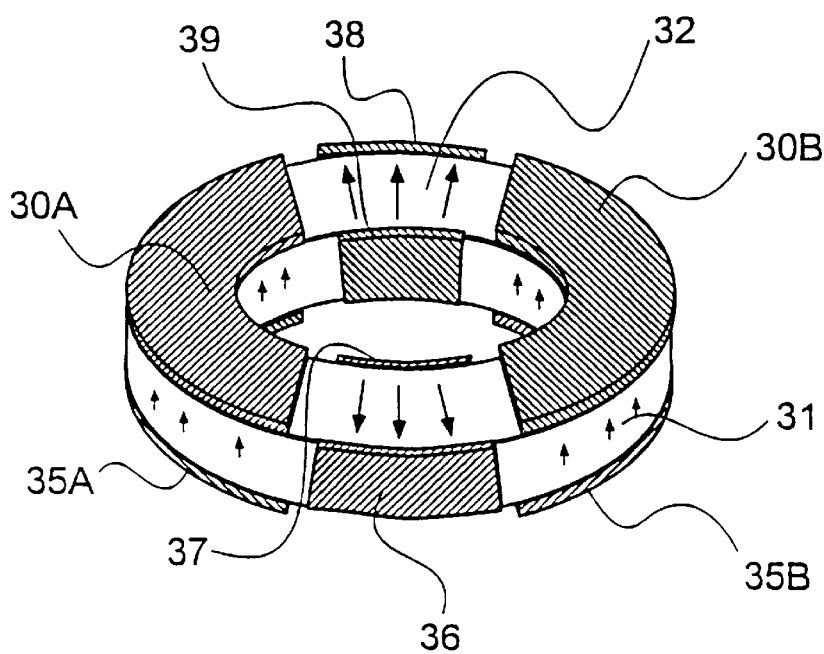
FIG. 7 is a perspective view of a fifth embodiment of the invention, wherein the output electrodes are at the inner and outer surfaces of the piezoelectric annulus.

Referring to FIG. 7, a further embodiment of the invention is illustrated wherein tangential polling is not employed. In this instance, the input electrodes are 30A, 30B and 35A, 35B. In lieu of piezoelectric ring 32 having tangential polling between the ends of the input electrodes, the polling within these regions is radial between output electrodes 36, 37, and 38, 39, respectively. Stepped-up outputs can be taken either between output electrodes 36, 37 or between 38, 39.

When input electrodes 30A, 30B and bottom electrodes 35A, 35B are coupled together an input signal applied between 30A and 35A at a second mode resonance frequency, causes two stepped up identical output voltages to be developed between output electrodes 36,37 and 38, 39.

Experimental

The transformer shown in FIG. 3 was fabricated such that the piezoelectric body had an outside diameter (OD) of 11.0 mm, an inside diameter (ID) of 5.0 mm and a thickness (t) of 0.5 mm. Silver electrodes were coated to driving and driven regions. All the non-electroded gaps on top and bottom surfaces of piezoelectric ring had a 1.0 mm length.

Referring to FIG. 3B, the surface of the piezoelectric ring was divided into four sections so that the opposite section became equal to each other. The two larger sections were covered by the electrode material (i.e., 20A and 20B). The bottom surface of the piezoelectric ring was also divided similar to the top surface. The larger two sections on the bottom surface were also covered by the electrode material (i.e., 25A and 25B).

A narrow slit of the electrode material was pasted on the other two smaller sections of the divided area of the piezoelectric ring. A narrow slit of electrode material was also pasted on the bottom, inner and the outer surface of the piezoelectric ring (i.e., 26A and 26B). Then, the larger areas of the piezoelectric ring, between electrodes 20A, 25A and 20B, 25B, were poled perpendicular to the plane of the piezoelectric ring. These parts are called driver regions when the transformer operates to step up an ac voltage. Finally, four empty narrow regions were poled in the tangential direction to form the output or driven regions as follows; first, 20A, 20B, 25A and 25B are connected together and 26A and 26B are also connected together. Then, the positive terminal of a voltage which induces a high electric field was connected to 26A and 26B and the negative terminal to 20A and the other connected input electrodes. A dc voltage of 3.0 KV/mm was applied at a temperature of 120° C. to get the poling configuration as shown in FIG. 3B.

After polling, input terminals 20A and 20B were coupled with 25A and 25B, respectively. A sine wave input voltage of 1.0 volt was applied between 20A and 25A. An output voltage of 13 volts was obtained from the output terminals 26A and 26B when the piezoelectric ring vibrated at a first mode radial resonance frequency of 140 kHz. Approximately the same voltage was obtained at a second radial resonance frequency (246.6 kHz) of the piezoelectric ring.

The piezoelectric transformer was also driven at a third radial mode resonance frequency of 630.0 kHz. At this time, sine wave output voltages of 10 volts and 2.5 volts were obtained from output terminals 26A and 26B, respectively. The piezoelectric transformer was also driven at a different mode, when the input terminals 20A and 20B were coupled with 25B and 25A, respectively. An input sine wave voltage of 1 volt at 161.77 kHz was applied to the input terminals and two output sine waves of 14 volts from output terminals 26A and 26B were obtained, with a 180° out-of-phase shift. In other words, an output sine wave of 28 volts was obtained between output terminals 26A and 26B.

All the measurements were performed when a load resistance of 1.0 Mohm was connected between output terminal 26A (or 26B) and 25B (or 25B).

A desired transformation ratio of the present piezoelectric ceramic transformer can be obtained either by using a multilayer structure (changing the number of layers) or just by driving the transformer at a different radial resonance frequency. Impedance matching and efficiency optimization can also be achieved just by exciting a suitable radial mode resonance frequency of the piezoelectric ring.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A piezoelectric transformer comprising:
a piezoelectric material in a form of an annulus with opposed major surfaces bounding a thickness dimension, said annulus comprising at least a first segment and a second segment, said first segment bounded by a first electrode and a second electrode, and said second segment bounded by a third electrode and a fourth electrode, said first electrode and third electrode positioned on a common major surface and said second electrode and fourth electrode positioned on a common major surface, each segment comprising a circumferential extent of less than 180° of said annulus, each said first segment and second segment polled across said thickness dimension, and at least a third segment positioned between opposed ends of said first segment and second segment and polled in a direction generally tangential to said annulus, said third segment including a fifth electrode;

means for applying to electrodes bounding said first segment and said second segment, an input signal which excites said piezoelectric material to resonate at a resonant frequency thereof; and means for sensing an output signal from said fifth electrode.

2. The piezoelectric transformer as recited in claim 1 further comprising
a fourth segment positioned between opposed ends of said first segment and said second segment and positioned diametrically opposite said third segment and polled in a direction generally tangential to said annulus, said fourth segment including a sixth electrode positioned thereon, said means for sensing adapted to be coupled between said fifth electrode and said sixth electrode.

3. The piezoelectric transformer as recited in claim 2, wherein said first electrode and third electrode are commonly connected and said second electrode and fourth electrode are commonly connected and said input signal is coupled between said first electrode and said second electrode.

4. The piezoelectric transformer as recited in claim 2, wherein said first electrode and fourth electrode are commonly connected and said second electrode and third electrode are commonly connected and said input signal is coupled between said first electrode and said third electrode.

5. The piezoelectric transformer as recited in claim 1, wherein said first electrode and third electrode are commonly connected and said second electrode and fourth electrode are commonly connected, said input signal is coupled between said first electrode and said second electrode and said means for sensing is coupled between said fifth electrode and a common connection that is also coupled to said means for applying.

6. The piezoelectric transformer as recited in claim 1, wherein said piezoelectric material in a form of an annulus comprises plural piezoelectric layers separated by electrode layers.

7. The piezoelectric transformer as recited in claim 1 further comprising
a fourth segment positioned between opposed ends of said first segment and said second segment and diametrically opposite said third segment, said fourth segment and polled in a direction radial to said annulus, said fourth segment including a seventh electrode positioned on an outer circumference of said annulus and an eighth electrode positioned on an inner circumference of said annulus, and said means for sensing, if connected between said fifth electrode and said sixth electrode, obtains a first phase output or if connected between said seventh electrode and said eighth electrode, obtains a second phase output.

8. A piezoelectric transformer comprising:

a piezoelectric material in a form of an annulus with opposed major surfaces bounding a thickness dimension, said annulus comprising at least a first segment and a second segment, said first segment bounded by a first electrode and a second electrode, and said second segment bounded by a third electrode and a fourth electrode, said first electrode and third electrode positioned on a common major surface and said second electrode and fourth electrode positioned on a common major surface, each segment comprising a circumferential extent of less than 180° of said annulus, each said first segment and second segment polled across said thickness dimension, and at least a third segment positioned between opposed ends of said first segment and second segment and polled in a direction radial to said annulus, said third segment including a fifth electrode positioned on an outer circumference of said annulus and a sixth electrode positioned on an inner circumference of said annulus;

means for applying to electrodes bounding said first segment and said second segment, an input signal which excites said piezoelectric material to resonate at a resonant frequency thereof; and means for sensing an output signal between said fifth electrode and sixth electrodes.

9. A piezoelectric transformer comprising:

a piezoelectric material in a form of an annulus with opposed major surfaces bounding a thickness dimension, said annulus comprising at least a first segment bounded by first and second electrodes, a second segment bounded by third and fourth electrodes, a third segment bounded by fifth and sixth electrodes and a fourth segment bounded by seventh and eighth electrodes, said first, third, fifth and sixth electrodes positioned on a common major surface and said second, fourth, sixth and eighth electrodes positioned on a common major surface, each said segment comprising a circumferential extent of less than 90° of said annulus, each said segment polled across said thickness dimension, and fifth through eighth segments, respectively positioned between opposed ends of adjoining ones of said first through fourth segments, said fifth through eighth segments polled in a direction generally tangential to said annulus and including output electrodes positioned therein;

means for applying to electrodes bounding said first through fourth segments, an input signal which excites said piezoelectric material to resonate at a resonant frequency thereof; and means for sensing an output signal at a pair of said output electrodes.

* * * * *